United States Patent
Jang et al.

(10) Patent No.: US 7,781,234 B2
(45) Date of Patent: Aug. 24, 2010

(54) SEMICONDUCTOR PROCESS EVALUATION METHODS INCLUDING VARIABLE ION IMPLANTING CONDITIONS

(75) Inventors: Won-bae Jang, Osan-si (KR); Seung-chul Kim, Suwon-si (KR); Chan-seung Choi, Suwon-si (KR); Min-suk Kim, Suwon-si (KR); Chee-wan Kim, Seoul (KR); Sun-yong Lee, Seoul (KR); Sang-rok Hah, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 801 days.

(21) Appl. No.: 11/563,756

(22) Filed: Nov. 28, 2006

(65) Prior Publication Data
US 2007/0155028 A1  Jul. 5, 2007

(30) Foreign Application Priority Data
Dec. 29, 2005  (KR) .................... 10-2005-0133030

(51) Int. Cl.
*H01L 21/00* (2006.01)
(52) U.S. Cl. .................... 438/10; 438/14; 438/17; 438/795; 438/798; 257/E21.521; 257/E21.525; 257/E21.529; 257/E21.53; 257/E21.531
(58) Field of Classification Search .................... 438/10; 257/E21.531
See application file for complete search history.

(56) References Cited

U.S. PATENT DOCUMENTS

2004/0232350 A1  11/2004  Iwasawa et al.
2007/0284695 A1*  12/2007  Zani et al. .................... 257/607

FOREIGN PATENT DOCUMENTS

| JP | 2000-138179 A | 5/2000 |
|---|---|---|
| JP | 2003-86530 A | 3/2003 |
| JP | 2003-132835 A | 5/2003 |

OTHER PUBLICATIONS

Campbell, A.N.; Peterson, K.A.; Fleetwood, D.M.; and Soden, J.M.; "Effects on focused ion beam irradiation on MOS transistors"; Apr. 1, 1997; Conference Proceedings: IEEE international reliability physics symposium; Denver, CO; Department of Energy (DOE) OSTI ID: 456309; Report No. SAND-96-2512C; CONF-970428-1.*

* cited by examiner

*Primary Examiner*—Matthew C Landau
*Assistant Examiner*—Vicki B Booker
(74) *Attorney, Agent, or Firm*—Myers Bigel Sibley & Sajovec, P.A.

(57) ABSTRACT

Semiconductor process evaluation methods perform multiple scans of a test semiconductor substrate (e.g., test wafer) using ion beams under different ion implanting conditions. Parameters of the test semiconductor substrate that was scanned using the ion beams under different ion implanting conditions are then measured to conduct the semiconductor process evaluation.

18 Claims, 12 Drawing Sheets

FIG. 10

| DIVISION | PHOTOLITHOGRAPHY CONDITIONS | ION IMPLANTING CONDITIONS | THE NUMBER OF WAFER(S) | |
|---|---|---|---|---|
| FACTOR / CLASSIFICATION | THRESHOLD VALUE | ION DOSE | PRESENT INVENTION | PRIOR ART |
| REGION 1 | A1 | P3 | 1 WAFER | 9 WAFERS |
| REGION 2 | A1 | Q3 | | |
| REGION 3 | A1 | R3 | | |
| REGION 4 | A2 | P3 | | |
| REGION 5 | A2 | Q3 | | |
| REGION 6 | A2 | R3 | | |
| REGION 7 | A3 | P3 | | |
| REGION 8 | A3 | Q3 | | |
| REGION 9 | A3 | R3 | | |

SEMICONDUCTOR PROCESS EVALUATION METHODS INCLUDING VARIABLE ION IMPLANTING CONDITIONS

CROSS-REFERENCE TO RELATED PATENT APPLICATION

This application claims the benefit under 35 USC §119 of Korean Patent Application No. 10-2005-0133030, filed on Dec. 29, 2005, the disclosure of which is hereby incorporated by reference in its entirety as if set forth fully herein.

FIELD OF THE INVENTION

The present invention relates to a semiconductor device manufacturing methods, and, more particularly, to semiconductor process evaluation methods.

BACKGROUND OF THE INVENTION

In a semiconductor manufacturing process, a variety of test processes are performed to find out desired or optimal process conditions and/or to identify if a process performed under predetermined process conditions is desirable. In the test process, thickness, resistance and/or particles of a processed structure may be measured. Thus, since wafers may be damaged in the measuring process, there are frequent occasions when the test processes cannot be performed on a wafer on which actual devices are formed. In this case, a separate blank wafer is used as a test wafer for evaluating a process at a specific location of each wafer. After a process is performed on a production wafer, an identical process may be performed on the test wafer. The test process is performed on the test wafer in order to estimate the processing result of the production wafer.

The number of test wafers processed may increase as the number of processes requiring a test increases. As a result, the manufacturing cost of a corresponding semiconductor chip may increase. Particularly, a test wafer passing through a series of processes including an ion implanting process generally cannot be reused.

SUMMARY OF THE INVENTION

Semiconductor process evaluation methods according to some embodiments of the present invention perform multiple scans of a test semiconductor substrate (e.g., test wafer) using ion beams under different ion implanting conditions. Parameters of the test semiconductor substrate that was scanned using the ion beams under different ion implanting conditions are then measured to conduct the semiconductor process evaluation. Thus, according to some embodiments, a plurality of test semiconductor devices (also referred to as "unit devices"), which are used to identify optimum and/or desired process conditions for the final products, are formed on a single wafer using a variety of ion implanting conditions, which can reduce or minimize the number of wafers used for the process estimation and can reduce/minimize the evaluation costs.

According to some embodiments of the present invention, a semiconductor process evaluation method divides a test semiconductor substrate into a plurality of regions and scans the regions using ion beams under different ion implanting conditions. Parameters of the plurality of regions of the test semiconductor substrate that were scanned using the ion beams under different ion implanting conditions are measured, to conduct the semiconductor process evaluation.

The ion implanting conditions differ from each other by at least one process variable including ion dose, type of dopant, ion implanting energy, ion implanting angle, and/or notch orientation of the test semiconductor substrate.

The scanning of the regions may be performed by an ion implanting device using an electrostatic scan method, a mechanical scan method and/or a hybrid scan method.

The ion implanting conditions may be varied by varying an ion dose and, in order to vary the ion dose, the methods may further include varying a scan speed of the ion beams in a direction of the test semiconductor substrate.

A scan length of one scan of the ion beams may be greater or less than a diameter of the test semiconductor substrate.

In other embodiments, the ion implanting conditions may be varied by varying an ion dose, and in order to vary the ion dose, the method may further include moving the test semiconductor substrate at a variable speed. The moving of the test semiconductor substrate may be performed in a vertical and/or horizontal direction.

The scanning of the region may include scanning the test semiconductor substrate using the ion beams while varying the ion implanting condition in a first direction of the test semiconductor substrate in a state where a notch is positioned in a first position and scanning of the test semiconductor substrate using the ion beams while varying the ion implanting condition in a second direction of the test semiconductor substrate in a state where the notch is positioned in a second position.

In order to displace the notch from the first position to the second position, the test semiconductor substrate may rotate by a predetermined angle about a rotational axis that is located at a center of the test semiconductor substrate.

Alternatively, the ion implanting conditions may be varied by varying an ion dose, and the scanning of the test semiconductor substrate can include scanning the test semiconductor substrate using the ion beams while varying a scan speed of the ion beams in a first direction of the test semiconductor substrate in a state where a notch is positioned in a first position and scanning the test semiconductor substrate using the ion beams while varying the scan speed of the ion beams in a second direction of the test semiconductor substrate in a state where the notch is positioned in a second position. In order to displace the notch from the first position to the second position, the test semiconductor substrate may rotate by a predetermined angle about a rotational axis that is located at the center of the semiconductor substrate.

These methods may further include, after the scanning the test semiconductor substrate, dividing at least one region of the test semiconductor substrate into a plurality of sub-regions and forming different metal line layers on the sub-regions.

The metal line layers may form word lines, bit lines, capacitor electrodes, fuses, and/or conductive pads. When the metal line layers form word lines, the word lines can have different widths according to the sub-regions.

According to other embodiments of the present invention, semiconductor process evaluation methods include forming a plurality of different metal line layers on respective divided regions of a test semiconductor substrate, dividing at least one of the divided regions into a plurality of sub-regions and scanning the sub-regions using ion beams under different ion implanting conditions. Parameters of the plurality of sub-regions of the test semiconductor substrate that were scanned using the ion beams under different ion implanting conditions are measured, to conduct the semiconductor process evaluation.

The metal line layers may form gate electrode layers and the gate electrode layers of the regions may have different lengths from each other.

By performing the scanning of the sub-regions using the ion beams, ion implanting regions for controlling a threshold voltage of transistors formed by the gate electrode layers, source/drain regions, shallow ion implanting regions and/or lightly doped drain regions may be formed in the test semiconductor substrate under the gate electrode layers by scanning the ion beam.

According to some embodiments of the present invention, since the unit devices that are different from each other in structure and/or processing conditions can be formed on the respective divided regions of a given test semiconductor wafer, the variety of process estimations that are used in a variety of processes for manufacturing the semiconductor devices can be performed using only one semiconductor wafer or a small number thereof, thereby reducing or minimizing the parameter estimation costs. In addition, since the variety of process estimations can be performed by a simple method, the turn around time can be shortened.

BRIEF DESCRIPTION OF THE DRAWINGS

The above and other features and advantages of the present invention will become more apparent by describing in detail exemplary embodiments thereof with reference to the attached drawings in which:

FIG. 10 is a table illustrating a case where unit devices are formed on a test semiconductor substrate using conditions given as examples in FIG. 7C according to methods of FIGS. 1 through 8.

DETAILED DESCRIPTION OF THE INVENTION

Figure 1:
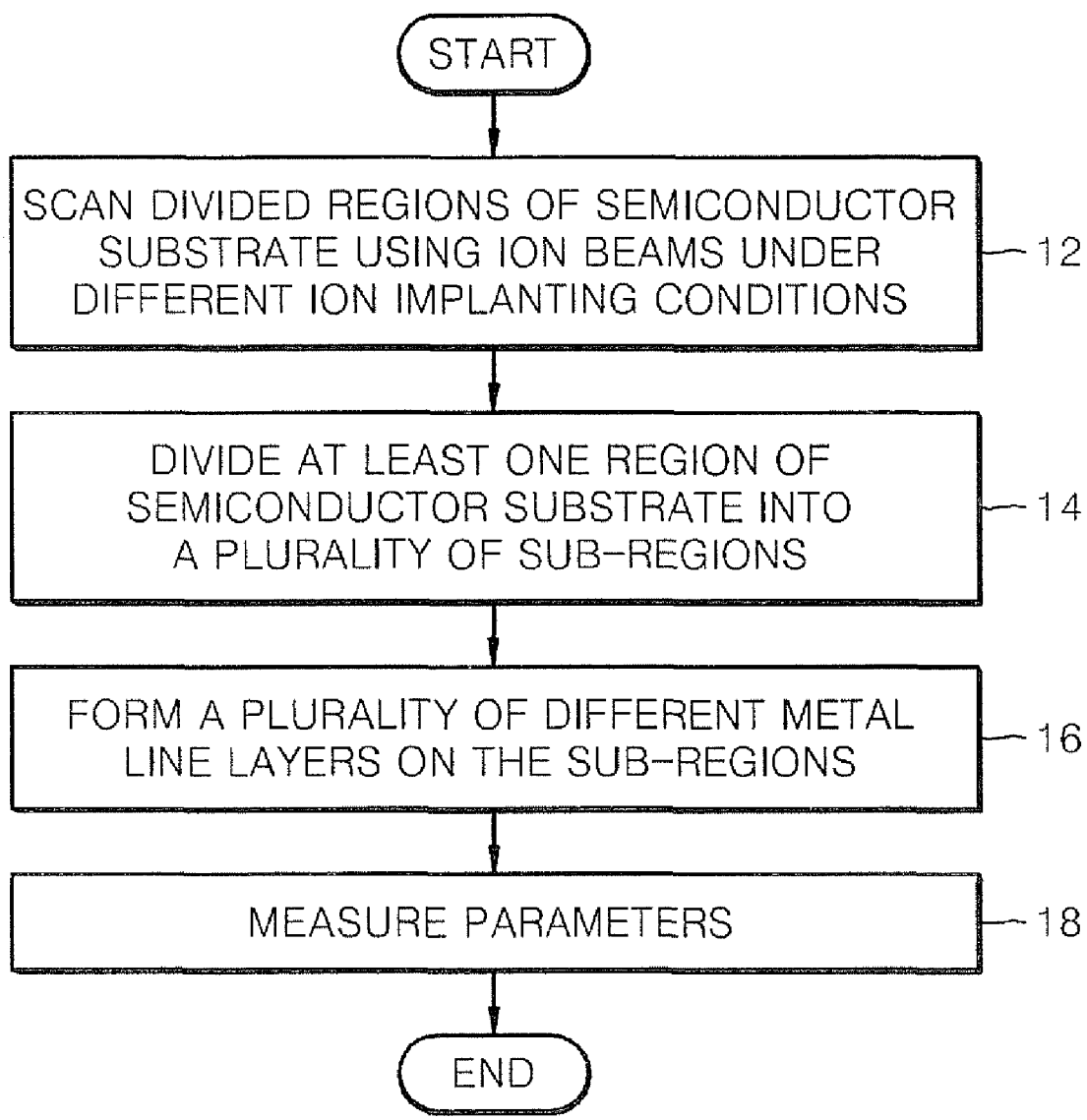
FIG. 1 is a flowchart of semiconductor process evaluation methods according to some embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly. Moreover, the term "beneath" also indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Some embodiments of the invention may arise from recognition that, in conventional semiconductor process evaluation methods, one unit device is formed on one wafer by applying only one set of process conditions when processing the wafer in order to evaluate an ion implanting process. Therefore, the number of wafers used generally is identical to the number of sets of ion implanting conditions that will be tested. Different sets of ion implanting conditions are applied to the wafers and the wafers are tested. One of these conditions may relate to an ion beam which scans a surface of a wafer at a uniform speed to implant ions on the surface of the wafer under uniform conditions or where the wafer moves at a uniform speed if the ion beam is emitted at a fixed location.

Moreover, some embodiments of the invention may arise from recognition that, when the process evaluation is performed according to the conventional methods, the number of test wafers increases both as the number of actual wafers produced and the number of ion implanting processes used increase. In addition, when the process evaluation is performed for all of a variety of process variables of other processes such as a photolithography which are combined with a variety of process variables that will be tested in the ion implanting process, the number of wafers required for the process evaluation may increase exponentially. As a result, the cost of manufacturing the semiconductor chips may increase dramatically. Furthermore, the time required for performing the process evaluation of the test wafers may increase, which can reduce productivity.

In sharp contrast, semiconductor process evaluation methods according to some embodiments of the present invention perform multiple scans of a test semiconductor substrate (e.g., wafer) using ion beams under different ion implanting conditions. Parameters of the test semiconductor substrate that was scanned using the ion beams under different ion implanting conditions are measured, to conduct the semiconductor process evaluation. Accordingly, a single test substrate, or a small number thereof, may be used to test a large number of different ion implanting conditions/parameters.

FIG. 1 is a flowchart of semiconductor process evaluation methods according to some embodiments of the present invention.

Referring to FIG. 1, ion beams under different ion implantation conditions scan a plurality of regions of a test semiconductor substrate or wafer (Block 12). The test semiconductor substrate may be divided into a plurality of regions of a variety of shapes. The semiconductor substrate may comprise a single element and/or compound semiconductor substrate, such as a monocrystalline silicon substrate, and may include one or more epitaxial and/or other conductive/insulating layers thereon.

FIGS. 2A through 2F are diagrams showing examples of shapes into which a test semiconductor substrate 10 can be divided.

Figure 2A:
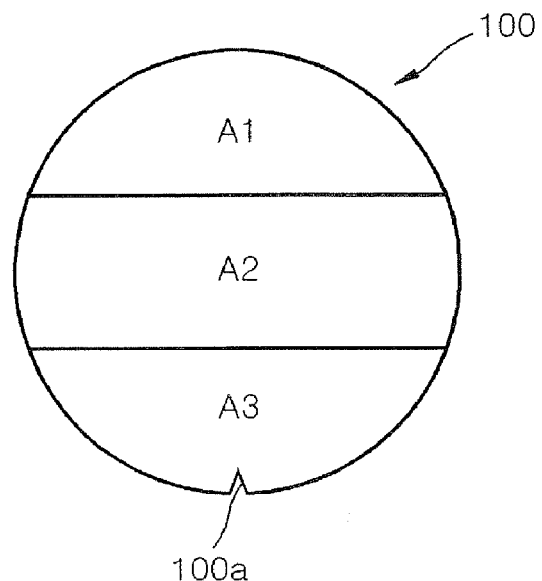
FIGS. 2A through 2F are diagrams showing a variety of shapes into which a test semiconductor substrate can be divided according to some embodiments of the present invention.
Figure 2B:
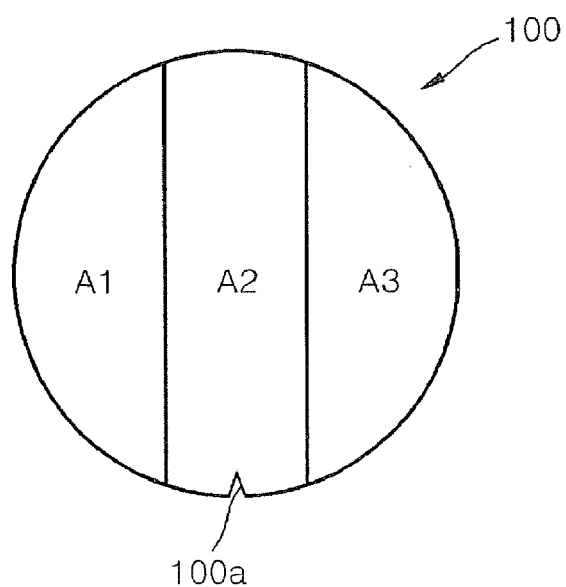
Figure 2C:
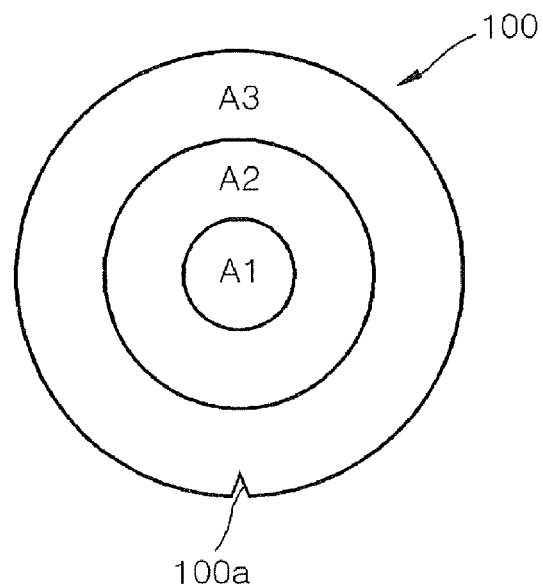
Figure 2D:
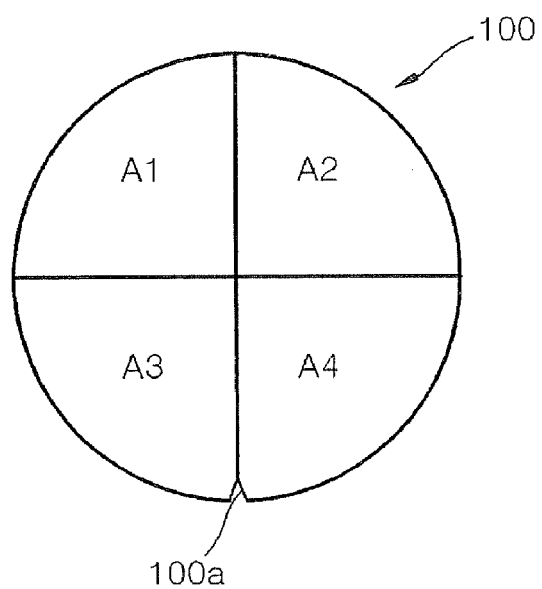
Figure 2E:
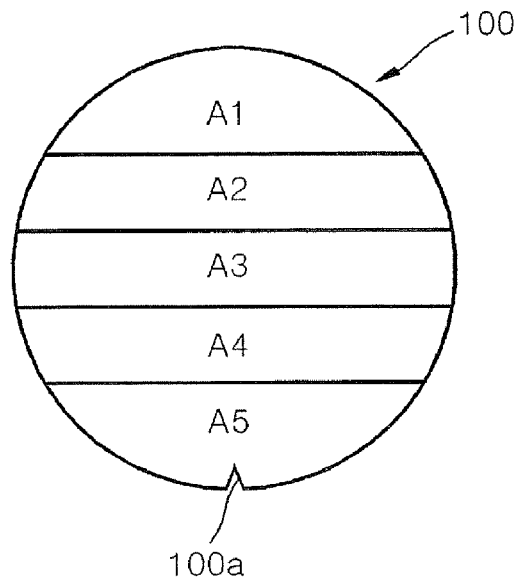
Figure 2F:
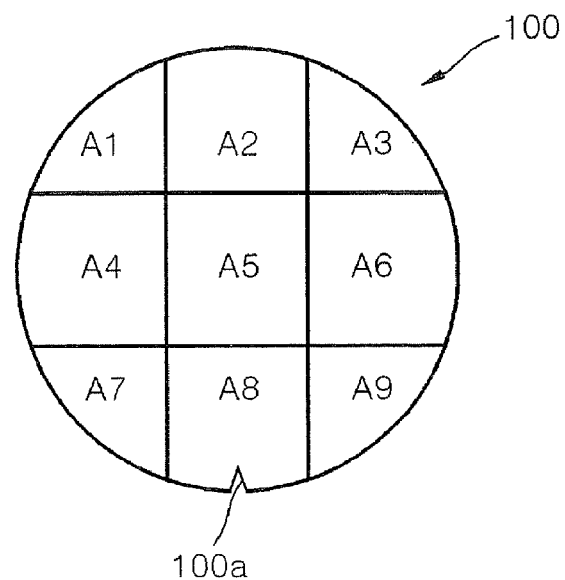

FIGS. 2A, 2B and 2C show examples where the test semiconductor substrate 100 is divided into three regions and these three regions are scanned by ion beams under three different ion implantation conditions A1, A2 and A3. FIG. 2D shows an example where the test semiconductor substrate 100 is divided into four regions and these four regions are scanned by the beams under four different ion implantation conditions A1, A2, A3, and A4. FIG. 2E shows an example where the test semiconductor substrate 100 is divided into five regions and these five regions are scanned by ion beams under five different ion implantation conditions A1, A2, A3, A4, and A5. FIG. 2F shows an example where the test semiconductor substrate 100 is divided into nine regions and these nine regions are scanned by ion beams under nine different ion implantation conditions A1, A2, A3, A4, A5, A6, A7, A8, and A9. In FIGS. 2A through 2F, the reference sign 100a indicates a notch. The relationship between the position of the notch 100a and the divided regions is not limited to the examples of FIGS. 2A through 2F. That is, the notch 100a may be formed at a variety of positions. In addition, the number and shape of the divided regions are not limited to the examples of FIGS. 2A through 2F.

The ion implantation conditions A1 through A9 are varied by varying at least one of a number of process variables such as an ion dose, a dopant type, an ion implantation energy, an ion implantation angle, and so on, that characterize the ion implantation process.

In order to scan the divided regions of FIGS. 2A through 2F, a variety of ion implantation devices using an electrostatic scan method, a mechanical scan method, a hybrid scan method, and so on can be used.

Figure 3:
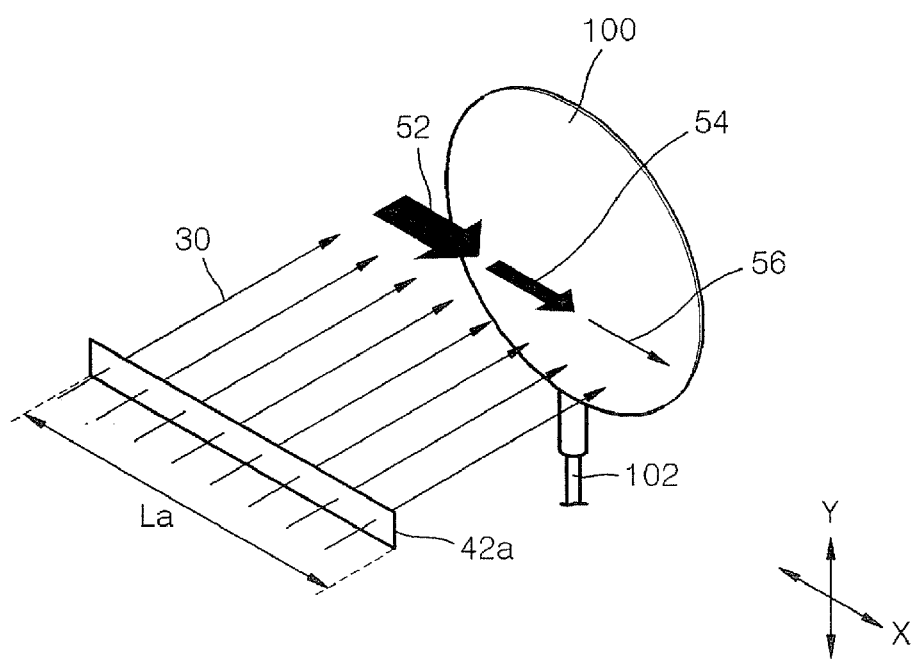
FIG. 3 is a view of electrostatic scan methods according to embodiments of the present invention.

FIG. 3 is a view of electrostatic scan methods of test semiconductor devices according to some embodiments of the present invention. In these electrostatic scan methods, the test semiconductor substrate 100 is fixed on an electrostatic chuck (not shown) installed on a driving shaft 102 and a scan in a direction of an X-axis, i.e., a horizontal direction, is repeated using ion beams 30, thereby scanning the test semiconductor substrate 100.

Referring to FIG. 3, in order to vary the ion dose according to the divided regions of the semiconductor substrate 100 when the ion beams 30 scan the test semiconductor substrate 100 through a slit 42a having a predetermined length La, the scan speed of the ion beams scanning the test semiconductor substrate 100 may vary. A variation of scan speeds for varying the ion dose according to the divided regions is represented by arrows 52, 54 and 56 in FIG. 3. wherein the thickness of each arrow is proportional to the scan speed of the ion beams 30 in corresponding divided regions. When the scan speed of the ion beams varies as shown in FIG. 3, an ion dose applied to the divided regions of the test semiconductor substrate can varied.

When the ion beams 30 scan the test semiconductor substrate 100 in the direction of the X-axis through the slit 42a, the scan length of one scan corresponding to the slit length La can be greater than a diameter of the test semiconductor substrate 100. However, the present invention is not limited to these embodiments. That is, when the ion beams 30 scan the divided regions, the scan length of one scan of the ion beams 30 may be set to be less than the diameter of the test semiconductor substrate 100.

Figure 4:
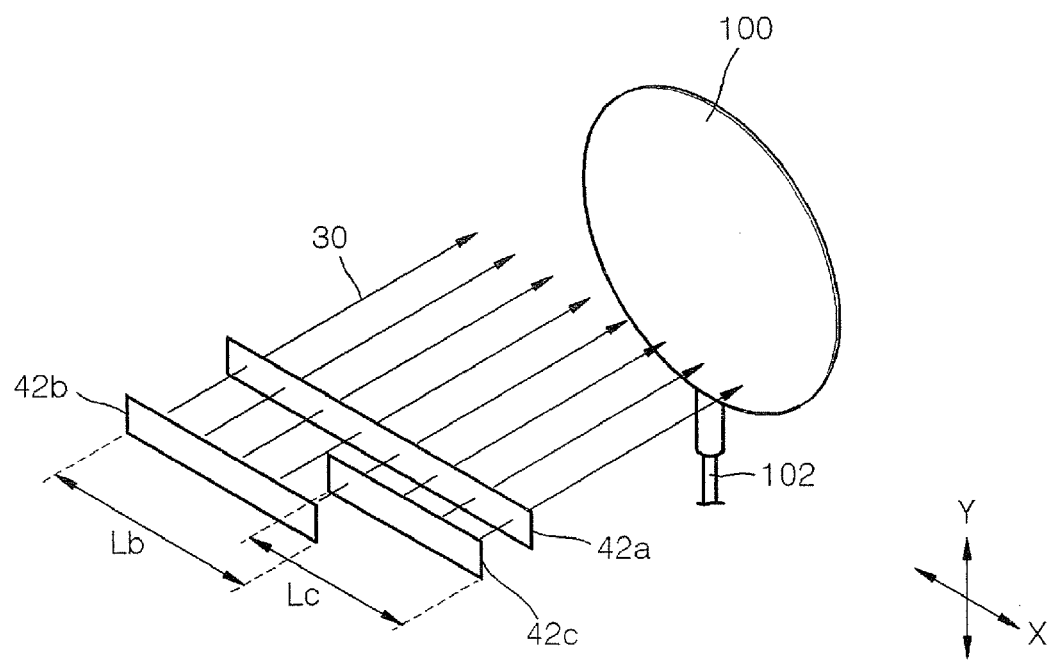
FIG. 4 is a view of modified versions of electrostatic scan methods of FIG. 3 according to embodiments of the present invention.

FIG. 4 is a view of a modified version of electrostatic scan methods of FIG. 3 according to embodiments of the present invention. Referring to FIG. 4, an ion implanting device for variously setting a one time scan length of the ion beams 30 is used. That is, the ion implanting device includes a slit 42a having a length La greater than the diameter of the test semiconductor substrate 100 and slits 42b and 42c respectively having one time scan lengths Lb and Lc that are less than the diameter of the test semiconductor substrate 100.

In FIG. 4, the ion beams scan the test semiconductor substrate across lengths Lb and Lc of the respective slits 42b and 42c. If required, as shown in FIG. 4, a variety of slits 42a, 42b and 43c of different scan lengths La, Lb and Lc may be provided or at least two of them may be provided. When the ion beams scan the test semiconductor substrate 100 by selectively or sequentially using the slits 42a, 42b and 42c, the ions can be implanted in a desired region of the test semiconductor substrate at a desired width. In addition, as illustrated in FIG. 3, the ion beams passing through the plurality of slits 42a, 42b and 42c can scan the test semiconductor substrate at a variable scan speed. That is, the scan speed may vary in the direction of the X-axis. When the ion beams scan the test semiconductor substrate 100 using the ion implanting methods of FIG. 4, a scan region, scan location and/or scan width of the scan of the semiconductor substrate can be effectively controlled by selectively using an appropriate slit and varying the location of the slit. In this case, an ion implanting device having a variety of slits may be used.

Figure 5:
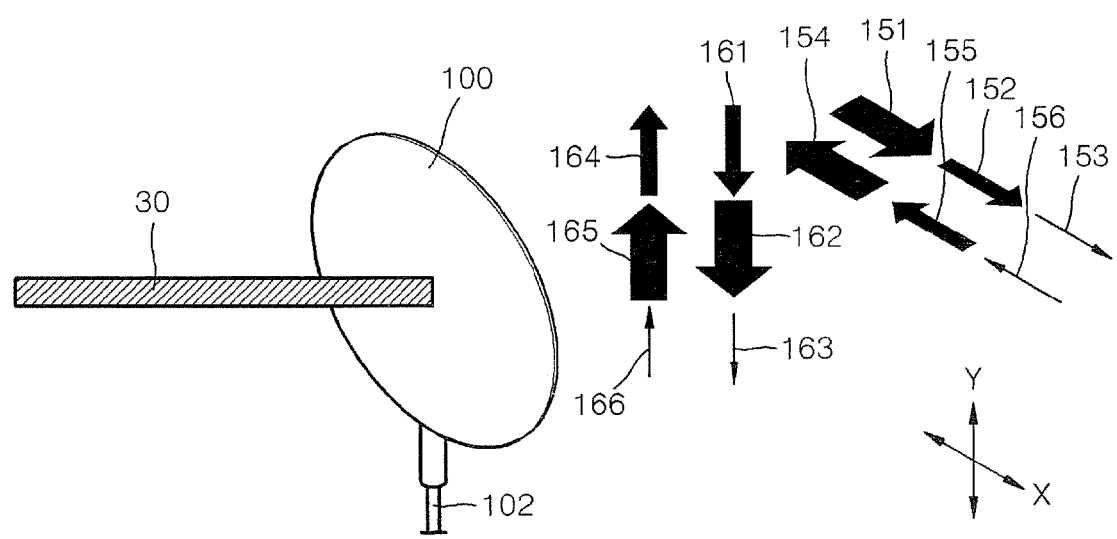
FIG. 5 is a view of mechanical scan methods according to other embodiments of the present invention.

FIG. 5 is a view of mechanical scan methods of test semiconductor devices according to other embodiments of the present invention. In the mechanical scan methods, the locations of the ion beams 30 are fixed and the ion beams scan the test semiconductor substrate 100 as the test semiconductor substrate 100 moves in a direction of the X or Y-axis (the horizontal or vertical direction) or rotates.

Referring to FIG. 5, in order to vary the ion dose according to the divided regions of the test semiconductor substrate 100 when the ion beams 30 scan the test semiconductor substrate 100, a relative location of the test semiconductor substrate 100 to the ion beams 30 may vary and the moving speed of the test semiconductor substrate 100 may vary. A variation of horizontal moving speeds of the test semiconductor substrate 100 for varying the ion dose according to the divided regions is represented by arrows 151, 152, 153, 154, 155, and 156. A variation of vertical moving speeds of the test semiconductor substrate 100 in the vertical direction for varying the ion dose according to the divided regions is represented by arrows 161, 162, 163, 164, 165, and 166. In FIG. 5, the direction and moving speed represented by the arrows may vary in accordance with the desired ion implanting condition.

In FIG. 5, the thickness of each arrow is proportional to the moving speed of the test semiconductor substrate 100. As shown in FIG. 5, when the moving speed of the test semiconductor substrate 100 varies, a variety of ion doses can be applied to the divided regions of the test semiconductor substrate by the ion beams 30.

When an ion implanting device using hybrid scan methods combining the methods of FIGS. 3 and 5 is used, an identical effect can be obtained. In the ion implanting device using the hybrid scan methods, the ion beams can move in a first direction on a plane while the test semiconductor substrate 100 can move in a second direction crossing the first direction at an angle, such as a right angle, on the plane, in the course of which the ion beams scan the test semiconductor substrate.

When the ion implanting methods of FIGS. 3 and 5 or the hybrid scan methods combining the ion implanting methods of FIGS. 3 and 5 are used, the divided regions of the test semiconductor substrate can be formed under a variety of different ion implanting conditions by combining the variation of the scan speed of the ion beams in a predetermined direction and the rotation of the test semiconductor substrate 100 and/or combining the variation of the moving speed of the test semiconductor substrate 100 in a predetermined direction and the rotation of the test semiconductor substrate 100.

Figure 6A:
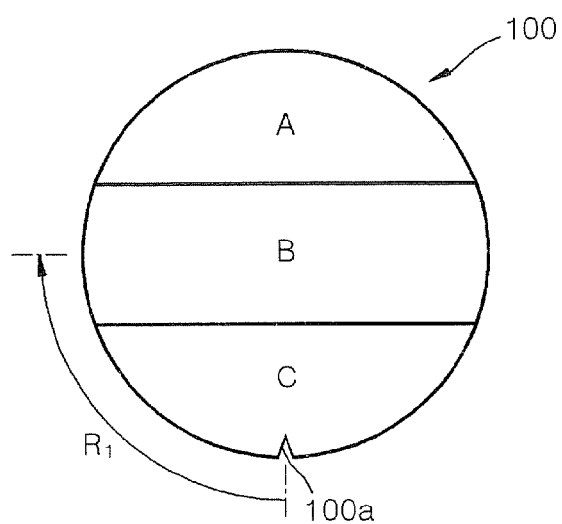
FIGS. 6A through 6C are sequential views illustrating processes for forming divided regions on a test semiconductor substrate using electrostatic scan methods of FIG. 3 or 4, or mechanical scan methods of FIG. 5, and by rotating the test semiconductor substrate according to some embodiments of the present invention.
Figure 6B:
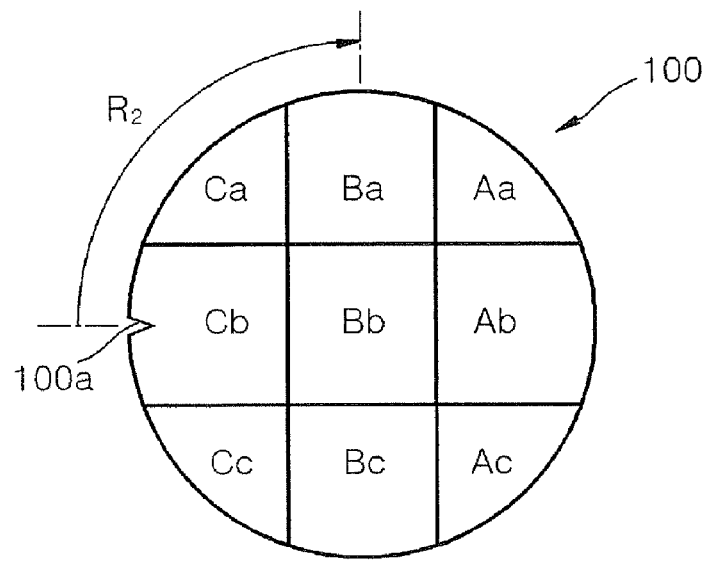
Figure 6C:
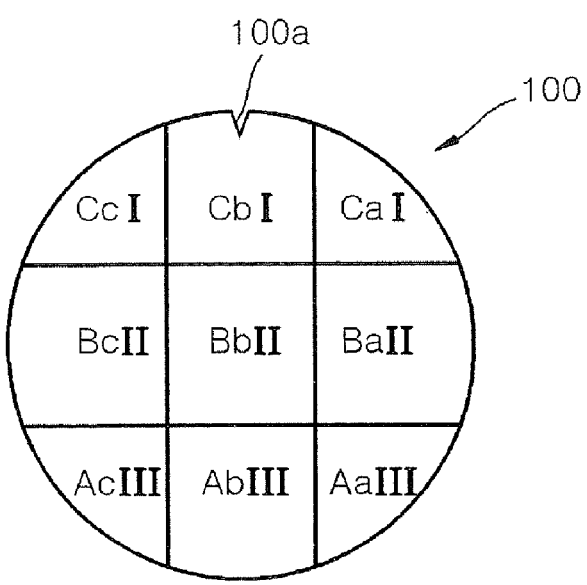

FIGS. 6A through 6C are sequential views illustrating processes for forming the divided regions on a test semiconductor substrate 100 using the electrostatic scan methods of FIG. 3 or 4 or the mechanical scan methods of FIG. 5 and by rotating the semiconductor substrate 100 according to some embodiments of the present invention.

Referring first to FIG. 6A, the test semiconductor substrate 100 is first divided into three regions and these three regions are scanned by ion beams under three different ion implanting conditions A, B and C. The ion implanting conditions A, B and C differ from each other by at least one process variable such as ion dose, type of dopant, ion implanting energy, and/or ion implanting angle. Then, the test semiconductor substrate 100 is rotated 90° in a direction denoted by arrow R1.

Referring to FIG. 6B, by rotating the test semiconductor substrate 100 by 90°, the notch 100a is displaced by 90°, in a clockwise direction of FIG. 6B, to a position shown on FIG. 6B. In this state, the test semiconductor substrate 100 is further divided into three regions and these three regions are scanned by ion beams under three different ion implanting conditions a, b and c. The ion implanting conditions a, b and c differ from each other by at least one process variable such as ion dose, type of dopant, ion implanting energy, and/or ion implanting angle. Therefore, each of the three regions divided in FIG. 6a is further divided into three regions. As a result, nine regions scanned under different ion implanting conditions are formed on the test semiconductor substrate 100. Then, the test semiconductor substrate 100 is rotated 90° in a direction denoted by arrow $R_2$.

Referring to FIG. 6C, by rotating the test semiconductor substrate 100 by 90°, the notch 100a is displaced by 90°, in a clockwise direction of FIG. 6C, to a position shown on FIG. 6C. In this state, the test semiconductor substrate 100 is further divided into three regions and these three regions are scanned by ion beams under three different ion implanting conditions I, II and III. The ion implanting conditions I, II and III differ from each other by at least one process variable such as ion dose, type of dopant, ion implanting energy, and/or ion implanting angle. As a result, nine regions scanned under different ion implanting conditions are formed on the test semiconductor substrate 100.

The relationship between the position of the notch 100a and the divided regions is not limited to the examples of FIGS. 6A through 6C. The regions may be divided using a variety of directions of orientation of the notch 100a. That is, the notch 100a may be formed at a variety of positions. In addition, the number and shapes of the divided regions are not limited to the embodiment of FIGS. 6A through 6C.

Referring again to FIG. 1, after the plurality of regions are formed on the test semiconductor substrate 100 under different ion implanting conditions (Block 12), at least one region of the semiconductor substrate 100 is further divided into a plurality of sub-regions (Block 14).

Then, a plurality of metal line layers are formed on the sub-regions under different conditions such that the sub-regions each have different shapes (Block 16).

Finally, the parameters of the plurality of regions and/or sub-regions of the test semiconductor substrate 100 that were scanned using the ion beams under different ion implanting conditions are measured, to conduct the semiconductor process evaluation (Block 18). Multiple conventional measurement techniques may be used for a given test semiconductor substrate 100, corresponding to the multiple regions and/or sub-regions. The individual parameter measurement techniques are well known to those having skill in the art and need not be described in detail herein.

Figure 7A:
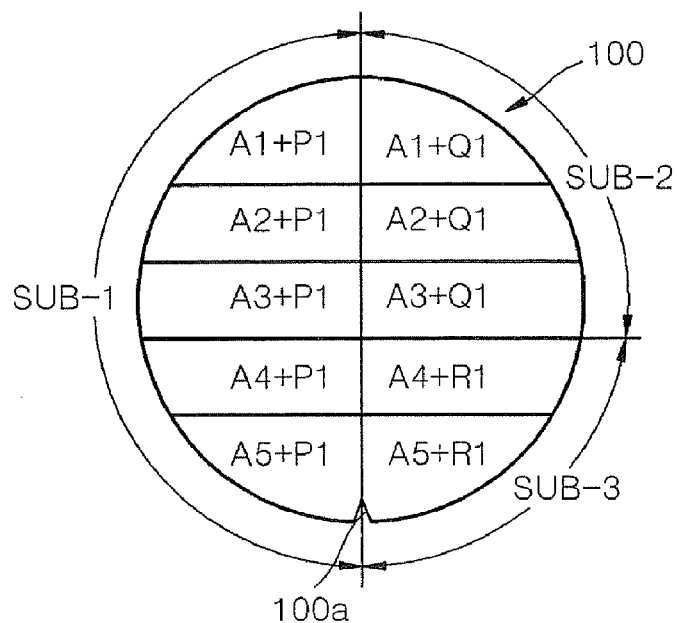
FIGS. 7A through 7C are diagrams showing examples where metal line layers are formed on the sub-regions which are formed under the different ion implanting conditions according to some embodiments of the present invention.
Figure 7B:
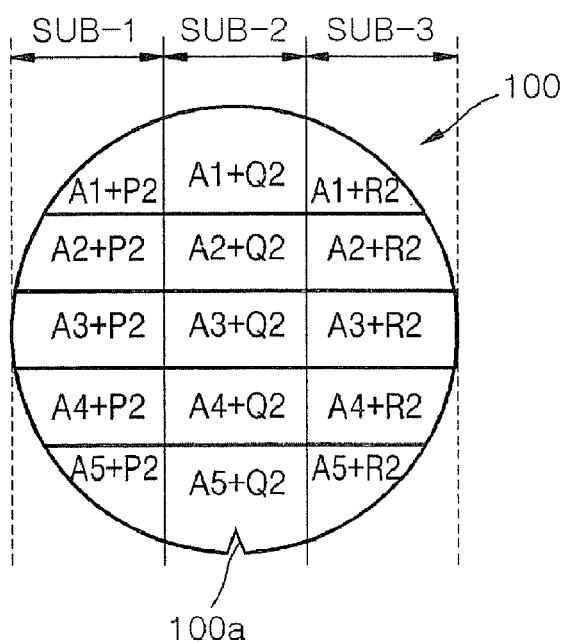
Figure 7C:
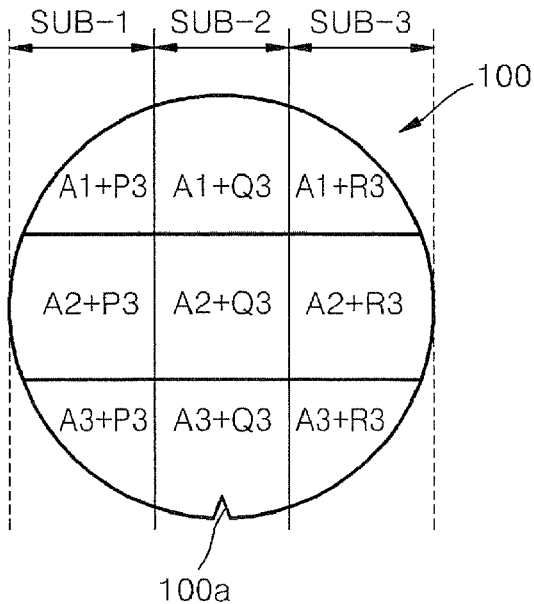

FIGS. 7A through 7C are diagrams showing examples where metal line layers are formed on the sub-regions which are formed under the different ion implanting conditions according to some embodiments of the invention.

Referring to FIG. 7A, corresponding to the example shown in FIG. 2E, the test semiconductor substrate 100 is divided into five regions and these five regions are scanned by the ion beams under five different ion implantation conditions A1, A2, A3, A4, and A5. Then, the test semiconductor substrate 100 is further divided into three sub-regions SUB-1, SUB-2 and SUB-3. The metal line layers are formed on the three sub-regions SUB-1, SUB-2 and SUB-3 under three different photolithography conditions P1, Q1 and R1, respectively.

Referring to FIG. 7B, also corresponding to the example shown in FIG. 2E, the test semiconductor substrate 100 is divided into five regions and these five regions are scanned by the ion beams under five different ion implantation conditions A1, A2, A3, A4, and A5. Then, the test semiconductor substrate 100 is further divided into three sub-regions SUB-1, SUB-2 and SUB-3. The metal line layers are formed on the three sub-regions SUB-1, SUB-2 and SUB-3 under three different photolithography conditions P2, Q2 and R2, respectively.

Referring to FIG. 7C, corresponding to the example shown in FIG. 2A, the test semiconductor substrate 100 is divided into three regions and these three regions are scanned by the ion beams under three different ion implantation conditions A1, A2, and A3. Then, the test semiconductor substrate 100 is further divided into three sub-regions SUB-1, SUB-2 and SUB-3. The metal line layers are formed on the three sub-regions SUB-1, SUB-2 and SUB-3 under three different photolithography conditions P3, Q3 and R3, respectively.

In FIGS. 7A, 7B and 7C, the metal line layers formed under different conditions using a photolithography process may have different widths. For example, thee metal line layers may correspond to word lines, bit lines, capacitor electrodes, fuses and/or conductive pads that may be used in manufacturing a semiconductor device. When the metal line layers are word lines forming gate electrodes, different photolithography conditions may be applied such that the gate electrodes of the sub-regions each have a different length.

In the methods of FIG. 1, after the plurality of regions are formed on the test semiconductor substrate 100 under different ion implanting conditions (Block 12), at least one region of the test semiconductor substrate 100 is further divided into the sub-regions and then different metal line layers are formed on the sub-regions. However, the present invention is not limited to this order of the process of FIG. 1. For example, the ion implanting process may be performed after the metal line layers are formed.

Figure 8:
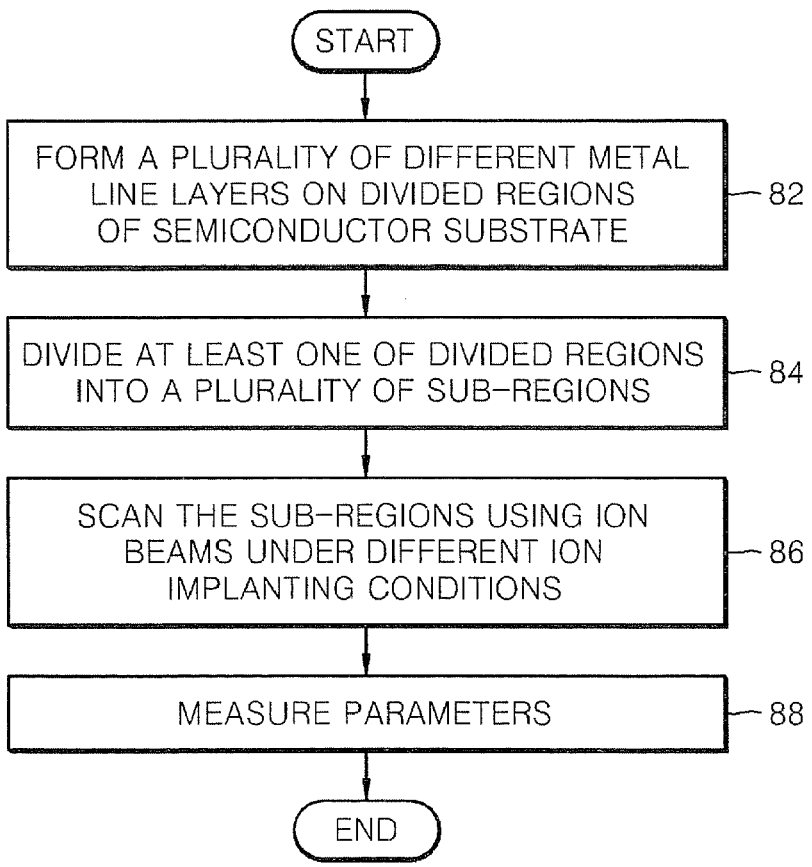
FIG. 8 is a schematic flowchart of semiconductor process evaluation methods according to other embodiments of the present invention.

FIG. 8 is a schematic flowchart of other embodiments of the present invention. These embodiments are similar to FIG. 1, except that the metal line layers are first formed on the test semiconductor substrate under a variety of different photolithography conditions.

A plurality of metal line layers that have different shapes from each other are respectively formed to divide the test semiconductor substrate into regions (Block 82).

Figure 9A:
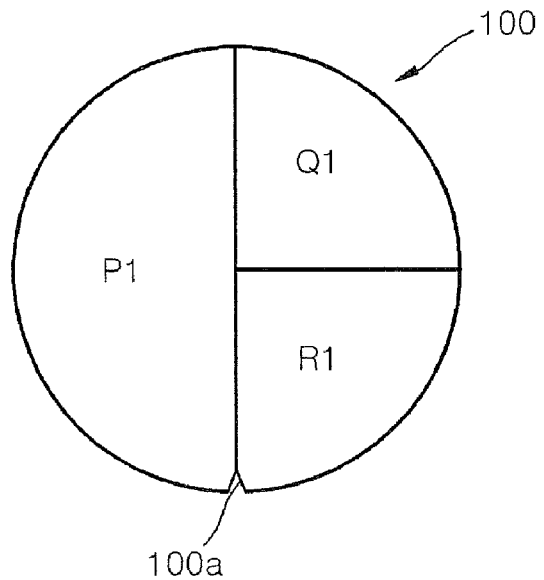
FIGS. 9A through 9C are diagrams showing a variety of regions into which a test semiconductor substrate can be divided and a variety of different metal line layers are formed on the divided regions according to some embodiments of the present invention.
Figure 9B:
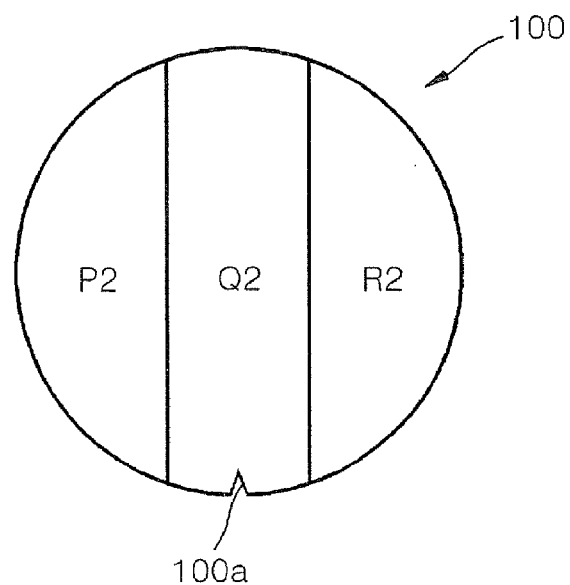
Figure 9C:
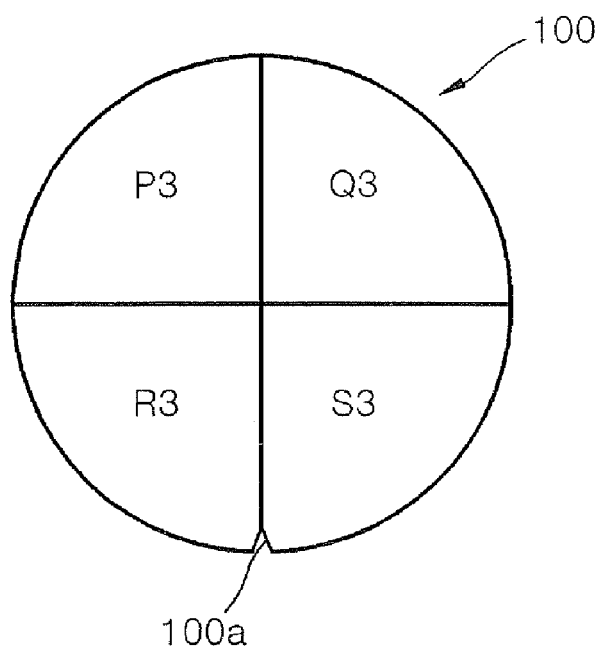

FIGS. 9A through 9C are diagrams showing a variety of regions into which a test semiconductor substrate can be divided and a variety of different metal line layers are formed on the divided regions according to some embodiments of the present invention. Referring to FIGS. 9A through 9C, the test semiconductor substrate 100 is divided into a plurality of different regions and a variety of different metal line layers are formed on the divided regions.

Referring to FIG. 9A, the test semiconductor substrate 100 is divided into three regions and three different metal line layers are formed on these three regions using different photolithography conditions P1, Q1 and R1. Referring to FIG. 9B, the test semiconductor substrate 100 is divided into three regions and three different metal line layers are formed on these three regions using different photolithography conditions P2, Q2 and R2. Referring to FIG. 9C, the test semiconductor substrate 100 is divided into four regions and four different metal line layers are formed on the these three regions using different photolithography conditions P3, Q3, R3, and S3.

Then, at least one of the divided regions is divided into a plurality of sub-regions (Block 84). In order to realize this, the examples of FIGS. 2A through 2F may be applied.

Next, the sub-regions are scanned by ion beams under different ion implanting conditions (Block 86). At this point, a variety of combinations of ion implantation conditions of similar to the examples shown in FIGS. 3 through 5 and FIGS. 6A through 6C may be applied.

For example, the metal line layers of Block 82 can correspond to gate electrode layers, ion implanting regions, source/drain regions, shallow ion implanting regions and/or lightly doped drain regions and may be formed under the gate electrode layers by the ion beam scanning performed in Block 86. Alternatively, the metal line layers may be doped with ion impurities by the ion beam scanning performed in Block 86.

As a result, a variety of unit devices can be formed on the test semiconductor substrate 100 by the combinations of the regions formed through a variety of methods in Block 82 and the sub-regions formed through a variety of methods in Block 86. Parameters are then measured in Block 88.

FIG. 10 is a table illustrating a case where the unit devices are formed on a test semiconductor substrate using the conditions given as examples in FIG. 7C according to methods described with reference to FIGS. 1 through 8.

Referring to FIG. 10, it can be noted that, conventionally, nine unit devices are prepared using nine wafers for nine different conditions. However, in some embodiments of the present invention, only one wafer is used to prepare nine unit devices using nine different preparation conditions.

In the above description, the ion implanting conditions, photolithography conditions and combinations thereof are applied as the process conditions for manufacturing the unit devices. However, the present invention is not limited to this case. That is, it will be understood by those of ordinary skill in the art that various other conditions and various combinations of different conditions can be applied to manufacture the unit devices using only one wafer.

According to the some embodiments of present invention, since unit devices that have different structures from each other and are formed using different conditions can be formed on the respective divided regions of one test semiconductor wafer, the variety of process evaluations that are performed for a variety of processes for manufacturing the semiconductor devices can be performed using only one test semiconductor wafer or a small number thereof, thereby reducing or minimizing the evaluation costs. In addition, since the variety of process evaluations can be performed by simple methods, the turn around time can be shortened. Furthermore, since the variety of process estimations can be easily performed, the process estimation efficiency and/or accuracy can be improved. As a result, the mass-production of the newly developed products can be achieved earlier.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor process evaluation method, comprising:
    dividing a test semiconductor substrate into a plurality of regions;
    scanning the regions using ion beams under different ion implanting conditions;
    measuring parameters of the plurality of regions of the test semiconductor substrate that were scanned using the ion beams under different ion implanting conditions, to conduct the semiconductor process evaluation;
    after scanning the test semiconductor substrate, dividing at least one region of the test semiconductor substrate into a plurality of sub-regions; and
    forming different metal line layers on the sub-regions.

2. The method of claim 1, wherein the ion implanting conditions differ from each other by at least one process variable including ion dose, type of dopant, ion implanting energy, ion implanting angle, and/or notch orientation of the test semiconductor substrate.

3. The method of claim 1, wherein the scanning of the regions is performed by an ion implanting device using an electrostatic scan method, a mechanical scan method and/or a hybrid scan method.

4. The method of claim 1, wherein the ion implanting conditions are varied by varying an ion dose and, in order to vary the ion dose, the method further comprises varying a scan speed of the ion beams in a direction of the test semiconductor substrate.

5. The method of claim 1, wherein a scan length of one scan of the ion beams is greater than a diameter of the test semiconductor substrate.

6. The method of claim 1, wherein the scan length of one scan of the ion beams is less than a diameter of the test semiconductor substrate.

7. The method of claim 1, wherein the ion implanting conditions are varied by varying an ion dose, and in order to vary the ion dose, the method further comprises moving the test semiconductor substrate at a variable speed.

8. The method of claim 7, wherein the moving of the test semiconductor substrate is performed in a vertical direction.

9. The method of claim 7, wherein the moving of the test semiconductor substrate is performed in a horizontal direction.

10. The method of claim 1, wherein the scanning of the regions comprises:
    scanning the test semiconductor substrate using the ion beams while varying the ion implanting condition in a first direction of the test semiconductor substrate in a state where a notch is positioned in a first position; and
    scanning the test semiconductor substrate using the ion beams while varying the ion implanting condition in a second direction of the test semiconductor substrate in a state where the notch is positioned in a second position.

11. The method of claim 10, wherein, in order to displace the notch from the first position to the second position, the test semiconductor substrate rotates by a predetermined angle about a rotational axis that is located at a center of the test semiconductor substrate.

12. The method of claim 1, wherein the ion implanting conditions are varied by varying an ion dose and wherein the scanning of the test semiconductor substrate comprises:
    scanning the test semiconductor substrate using the ion beams while varying a scan speed of the ion beams in a first direction of the test semiconductor substrate in a state where a notch is positioned in a first position; and
    scanning the test semiconductor substrate using the ion beams while varying the scan speed of the ion beams in a second direction of the test semiconductor substrate in a state where the notch is positioned in a second position.

13. The method of claim 12, wherein in order to displace the notch from the first position to the second position, the test semiconductor substrate is rotated by a predetermined angle about a rotational axis that is located at a center of the test semiconductor substrate.

14. The method of claim 1, wherein the metal line layers form word lines, bit lines, capacitor electrodes, fuses and/or conductive pads.

15. The method of claim 14, wherein the metal line layers form the word lines and the word lines have different widths according to the sub-regions.

16. A semiconductor process evaluation method, comprising:
    performing multiple scans of a test semiconductor substrate using ion beams under different ion implanting conditions;
    measuring parameters of the test semiconductor substrate that was scanned using the ion beams under different ion implanting conditions, to conduct the semiconductor process evaluation;
    after scanning the test semiconductor substrate, dividing at least one region of the test semiconductor substrate into a plurality of sub-regions; and
    forming different metal line layers on the sub-regions.

17. The method of claim 16, wherein the ion implanting conditions differ from each other by at least one process variable including ion dose, type of dopant, ion implanting energy, ion implanting angle, and/or notch orientation of the test semiconductor substrate.

18. The method of claim 16, wherein the test semiconductor substrate is a test semiconductor wafer.

* * * * *